(12) United States Patent
Cok et al.

(10) Patent No.: US 11,137,641 B2
(45) Date of Patent: Oct. 5, 2021

(54) LED STRUCTURE WITH POLARIZED LIGHT EMISSION

(71) Applicant: X Display Company Technology Limited, Dublin (IE)

(72) Inventors: Ronald S. Cok, Rochester, NY (US); Christopher Bower, Raleigh, NC (US); Matthew Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 15/617,726

(22) Filed: Jun. 8, 2017

(65) Prior Publication Data

US 2017/0357127 A1   Dec. 14, 2017

Related U.S. Application Data

(60) Provisional application No. 62/348,449, filed on Jun. 10, 2016.

(51) Int. Cl.
*G02F 1/13357* (2006.01)
*G02F 1/1335* (2006.01)

(52) U.S. Cl.
CPC .... *G02F 1/133606* (2013.01); *G02F 1/13362* (2013.01); *G02F 1/133548* (2021.01);
(Continued)

(58) Field of Classification Search
CPC ... G02F 2001/133548; G02F 1/133548; G02F 1/133603; G02F 1/133606
See application file for complete search history.

(56) References Cited

U.S. PATENT DOCUMENTS

| 4,746,202 A | 5/1988 | Perilloux et al. |
| 5,060,027 A | 10/1991 | Hart et al. |

(Continued)

FOREIGN PATENT DOCUMENTS

| CN | 101390000 A | 3/2009 |
| EP | 1662301 A1 | 5/2006 |

(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).

(Continued)

*Primary Examiner* — Lucy P Chien
(74) *Attorney, Agent, or Firm* — Choate, Hall & Stewart LLP; William R. Haulbrook; Michael D. Schmitt

(57) ABSTRACT

A light-emitting diode (LED) structure includes an LED substrate having a first side and a second side opposing the first side. One or more light-emitting diodes are disposed on the first side and arranged to emit light through the LED substrate. In certain embodiments, a wire-grid polarizer is disposed on the second side and arranged to polarize light emitted from the one or more light-emitting diodes. A plurality of different colored LEDs or an LED with one or more color-conversion materials can be provided on the LED substrate to provide white light. A spatially distributed plurality of the LED structures can be provided in a backlight for a liquid crystal display. A polarization-preserving transmissive diffuser can diffuse light emitted from the LED toward the liquid crystal layer and a polarization-preserving reflective diffuser can diffuse light emitted from the LED away from the liquid crystal layer.

28 Claims, 8 Drawing Sheets

(52) U.S. Cl.
CPC .. *G02F 1/133603* (2013.01); *G02F 1/133621* (2013.01); *G02F 1/133614* (2021.01); *G02F 2202/36* (2013.01); *G02F 2203/01* (2013.01); *G02F 2203/02* (2013.01); *G02F 2203/05* (2013.01)

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,751,388 A * | 5/1998 | Larson .............. G02B 3/005 349/87 |
| 5,815,303 A | 9/1998 | Berlin |
| 5,917,572 A | 6/1999 | Kurauchi et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,835,940 B2 | 9/2014 | Hu et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,714 B2 | 8/2015 | Hu et al. |
| 9,105,813 B1 | 8/2015 | Chang |
| 9,139,425 B2 | 9/2015 | Vestyck |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,478,583 B2 | 10/2016 | Hu et al. |
| 9,520,537 B2 | 12/2016 | Bower et al. |
| 9,537,069 B1 | 1/2017 | Bower et al. |
| 9,601,356 B2 | 3/2017 | Bower et al. |

(56) References Cited

U.S. PATENT DOCUMENTS

| | | |
|---|---|---|
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,860,955 B2 | 1/2018 | Kim et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,997,501 B2 | 6/2018 | Bower et al. |
| 10,008,483 B2 | 6/2018 | Cok et al. |
| 10,078,239 B2 | 9/2018 | Sugita et al. |
| 10,209,813 B2 | 2/2019 | Yao et al. |
| 10,782,002 B2 | 9/2020 | Bower et al. |
| 2001/0022564 A1 | 9/2001 | Youngquist et al. |
| 2002/0096994 A1 | 7/2002 | Iwafuchi et al. |
| 2002/0118321 A1 | 8/2002 | Ge |
| 2002/0140646 A1 | 10/2002 | Sato et al. |
| 2002/0171792 A1 | 11/2002 | Kubota et al. |
| 2002/0171801 A1 | 11/2002 | Hsieh et al. |
| 2003/0117369 A1 | 6/2003 | Spitzer et al. |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0246811 A1 | 11/2006 | Winters et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0220459 A1 * | 9/2010 | Jagt ............... H01L 33/44 362/19 |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2011/0316008 A1 | 12/2011 | Yokogawa |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1 | 12/2012 | Rogers et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2013/0309792 A1 * | 11/2013 | Tischler ............... H01L 33/0079 438/28 |
| 2013/0329288 A1 | 12/2013 | Yim et al. |
| 2014/0014960 A1 | 1/2014 | Yamazaki et al. |
| 2014/0027709 A1 | 1/2014 | Higginson et al. |
| 2014/0027724 A1 | 1/2014 | Lim et al. |
| 2014/0082934 A1 | 3/2014 | Cok |
| 2014/0084482 A1 | 3/2014 | Hu et al. |
| 2014/0085214 A1 | 3/2014 | Cok |
| 2014/0094878 A1 | 4/2014 | Gossler et al. |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |

(56) References Cited

U.S. PATENT DOCUMENTS

| | | |
|---|---|---|
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0015517 A1 | 1/2015 | Zhao |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0255438 A1 | 9/2015 | Oraw et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0103547 A1 | 4/2016 | Lu et al. |
| 2016/0131329 A1 | 5/2016 | Park et al. |
| 2016/0211245 A1 | 7/2016 | Do |
| 2016/0233269 A1* | 8/2016 | Choi ............... H01L 33/007 |
| 2016/0260388 A1 | 9/2016 | Yata et al. |
| 2016/0266697 A1 | 9/2016 | Cheng et al. |
| 2016/0276326 A1* | 9/2016 | Natarajan ......... H01L 25/167 |
| 2016/0343772 A1 | 11/2016 | Bower et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0199429 A1* | 7/2017 | Kang ............... G02F 1/13306 |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0338374 A1 | 11/2017 | Zou et al. |
| 2017/0352646 A1 | 12/2017 | Bower et al. |
| 2017/0352647 A1 | 12/2017 | Raymond et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0211945 A1 | 7/2018 | Cok et al. |
| 2018/0226386 A1 | 8/2018 | Cok |
| 2018/0277525 A1 | 9/2018 | Cok et al. |
| 2018/0340681 A1 | 11/2018 | Cok |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11 -142878 | 5/1999 |
| JP | 2002-261335 A | 9/2002 |
| JP | 2010-103186 A | 5/2010 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-201 3/064800 A1 | 5/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 DIGEST, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applicaitons, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 × 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

(56) References Cited

OTHER PUBLICATIONS

Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

* cited by examiner

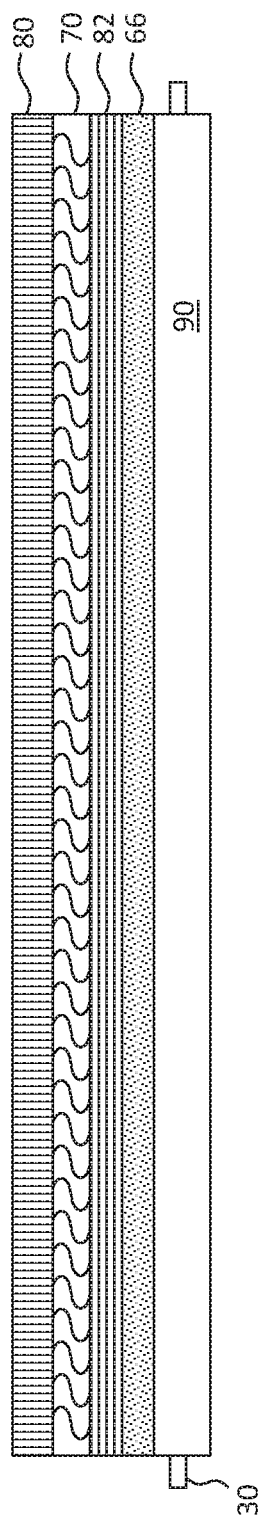
FIG. 11 – Prior Art

LED STRUCTURE WITH POLARIZED LIGHT EMISSION

PRIORITY APPLICATION

This application claims priority to and benefit of U.S. Patent Application No. 62/348,449, filed Jun. 10, 2016, entitled LED Structure with Polarized Light Emission, the content of which is hereby incorporated by reference in its entirety.

FIELD OF THE INVENTION

The present invention relates to light-emitting diode structures that provide polarized light useful in a backlight for a liquid crystal display.

BACKGROUND OF THE INVENTION

Liquid crystal displays (LCDs) are the dominant flat-panel displays in the industry today. As illustrated in prior-art FIG. 11 in a simplified form, LCDs typically consist of a backlight 90, either an edge-lit backlight with light-emitters at the edges of the backlight 90 (as shown), or a direct-lit backlight with light-emitters spatially distributed behind the viewing area of the flat panel (not shown). In prior designs, fluorescent light emitters were used to emit white light. In more recent years, light-emitting diodes (LEDs) provide the light. The LEDs can be different LEDs (for example emitting red, green, and blue light) or white light emitters that include a phosphor color-change layer, for example a blue-light emitting diode with a yellow phosphor layer.

The backlight 90 emits light through a diffuser layer 66 to provide uniform illumination through a rear polarizer layer 82 to a liquid crystal layer 82. The liquid crystal layer 70 is under the control of spatially distributed pixel electrodes that rotate the polarization of the light passing through the pixel in an on state and do not rotate the polarization of the light in an off state. The light from the liquid crystal layer 70 then passes through another front polarizer layer 80 that is oriented orthogonally to the rear polarizer layer 82. Thus, in the off state, the light from the backlight 90 is absorbed by the orthogonally arranged front and rear (back) polarizer layers 80, 82 so that the display pixel appears dark. In the on state, the liquid crystal layer 70 rotates the polarization of the light passing through the rear polarizer 82 so that it passes through the front polarizer layer 80 and the display pixel appears bright.

The liquid crystal layer 70 is generally encased between glass substrates (LC glass) on which the transparent controlling pixel electrodes are formed. The polarizers are usually made of polymer films. The backlight 90 can be one of the thickest elements in the structure due to either the size of the LEDs in a direct-lit backlight 90, or the need to propagate and distribute light over the backlight area in an edge-lit backlight 90. Edge-lit backlights 90 are usually thinner than direct-lit backlights 90 since the LEDs are on the edge of the backlight 90 and there is no need to distribute electrical power over the backlight 90.

An edge-lit backlight unit using a wire-grid polarizer in a liquid crystal display is described in U.S. Pat. No. 7,614,757. However, this design requires a wire-grid polarizer having a size approximately equal to the size of the display. Since wire-grid polarizers used in displays require very fine lithography, for example having wires with a pitch comparable to the wavelength of visible light, it is difficult to make them over large areas.

LEDs with polarized output are known. For example, an LED with a polished reflector design surrounding a light-emitting diode or by integrating photonic crystals, as described in *High-brightness polarized light-emitting diodes* published in *Light: Science & Applications* (2012) 1, e22; doi:10.1038/lsa.2012.22. However, such structures are difficult to make or can have less than desired polarization.

Small displays for mobile applications preferably have a light weight and a thin form factor, as well as low cost. Furthermore, for large displays it can be difficult to make the large polarizer and diffuser layers. There is a need, therefore, for display and backlight structures providing improved efficiency and reduced cost, weight, and thickness.

SUMMARY OF THE INVENTION

In some embodiments of the present invention, a light-emitting diode (LED) structure includes an LED substrate having a first side and a second side opposing the first side. One or more light-emitting diodes are disposed on the first side and arranged to emit light through the LED substrate. A wire-grid polarizer is disposed on the second side and arranged to polarize light emitted from the one or more light-emitting diodes. A plurality of different colored LEDs or one or more LEDs with one or more phosphors or one or more quantum dot (QD) color-change material(s) can be provided on the LED substrate to provide white light. A spatially distributed array of the LED structures can be provided in a backlight for a liquid crystal display. A polarization-preserving transmissive diffuser can diffuse the light emitted from the LED toward the liquid crystal layer or a polarization-preserving reflective diffuser can diffuse light emitted from the LED away from the liquid crystal layer. The LED structure can include two or more electrodes electrically connected to the one or more light-emitting LEDs and two or more connection posts electrically connected to the electrodes. In some embodiments, a reflective layer can be disposed on the first side of the LED substrate around the one or more LEDs or on other sides of the LED substrate.

The backlight can include one or more of the LED structures disposed on, over or adjacent to a polarization-preserving diffuser. The diffuser can include a holographic diffuser, metal, a metal coating, metal particles, or metal-coated particles. The diffuser can be a polarization-preserving reflective diffuser and the LED structures can be disposed between the polarization-preserving reflective diffuser and the liquid crystal layer. Alternatively, the diffuser is a polarization-preserving transmissive diffuser disposed between the LED structures and the liquid crystal layer. The diffuser can be a spatially variable diffuser. Alternatively, the backlight does not include a diffuser.

In some embodiments, a liquid crystal display includes a front polarizer layer, a liquid crystal layer and one or more LED structures. Each LED structure includes an LED substrate having a first side and a second side opposing the first side, one or more light-emitting diodes disposed on the first side and arranged to emit light through the LED substrate, and a wire-grid polarizer disposed on the second side and arranged to polarize light emitted from the one or more light-emitting diodes. The liquid crystal layer is disposed between the LED substrate and the front polarizer layer. An additional rear polarizer is not necessary so that the front polarizer layer is the only polarizer in the LCD other than the wire-grid polarizer. The LCD can include a transmissive polarization-preserving diffuser disposed between the one or more LEDs and the liquid crystal layer or a reflective polarization-preserving diffuser disposed on a side of the one or more LEDs opposite the liquid crystal layer.

Certain embodiments of the present invention provide a reduced number of layers, weight, thickness, and improved efficiency. By integrating many micro-transfer printed micro-LEDs on small substrates and providing a polarizer on each of the substrates, the cost to polarize light is reduced, uniformity is improved, and a thinner device with fewer layers and reduced weight is provided.

In another aspect, the disclosed technology includes one or more light-emitting diode (LED) structures, including: an LED substrate having a first side and a second side opposing the first side; one or more light-emitting diodes disposed on the first side and arranged to emit light through the LED substrate; and a wire-grid polarizer disposed on the second side and arranged to polarize light emitted from the one or more light-emitting diodes.

In certain embodiments, the LED substrate has additional sides other than the first and second sides and comprising a reflective layer disposed on the first side of the LED substrate around the one or more LEDs or on the additional sides of the LED substrate.

In certain embodiments, the one or more LEDs emit light of a first frequency and comprising a phosphor disposed on, in, or over the LED substrate to convert the light emitted from the one or more LEDs to light of a second frequency lower than the first frequency.

In certain embodiments, the LED structure is a white-light-emitting LED structure.

In certain embodiments, the one or more LEDs all emit light of the same color.

In certain embodiments, the one or more LEDs include different LEDs that emit different colors of light.

In certain embodiments, the LED structure includes two or more electrodes electrically connected to the one or more light-emitting LEDs and two or more connection posts electrically connected to the electrodes.

In another aspect, the disclosed technology includes a backlight, including: a diffuser; and one or more LED structures according to an embodiment described above disposed on, over, or adjacent to the diffuser.

In certain embodiments, the one or more LED structures are spatially distributed over, on, or adjacent to a common side of the diffuser.

In certain embodiments, the diffuser is a polarization-preserving diffuser.

In certain embodiments, the diffuser includes metal, a metal coating, metal particles, or metal-coated particles, or is a holographic diffuser.

In certain embodiments, the diffuser is a reflective diffuser.

In certain embodiments, the diffuser is a transmissive diffuser.

In certain embodiments, the diffuser is a spatially variable diffuser.

In certain embodiments, the backlight includes a liquid crystal layer and a front polarizer layer, wherein the diffuser is a transmissive diffuser, and wherein the liquid crystal layer is disposed between the front polarizer layer and the transmissive diffuser and the transmissive diffuser is between the liquid crystal layer and the one or more LED structures.

In certain embodiments, the backlight includes a liquid crystal layer and a front polarizer layer, wherein the diffuser is a reflective diffuser, and wherein the liquid crystal layer is disposed between the front polarizer layer and the one or more LED structures and the one or more LED structures are between the liquid crystal layer and the reflective diffuser.

In certain embodiments, the backlight includes a liquid crystal layer and a front polarizer layer, and wherein the liquid crystal layer is disposed between the front polarizer layer and the one or more LED structures.

In another aspect, the disclosed technology includes an LCD display, including: a front polarizer layer; a liquid crystal layer; one or more light-emitting diode (LED) structures, each LED structure including: an LED substrate having a first side and a second side opposing the first side; one or more light-emitting diodes disposed on the first side and arranged to emit light through the LED substrate; and a wire-grid polarizer disposed on the second side and arranged to polarize light emitted from the one or more light-emitting diodes; wherein the liquid crystal layer is disposed between the LED substrate and the front polarizer layer.

In certain embodiments, the LED structure provides polarized light, there is no rear polarizer layer between the LED structure and the liquid crystal layer and the front polarizer layer is the only polarizer other than the wire-grid polarizer.

In certain embodiments, the LCD display includes a transmissive polarization-preserving diffuser disposed between the one or more LEDs and the liquid crystal layer.

In certain embodiments, the LCD display includes a reflective polarization-preserving diffuser disposed one a side of the one or more LEDs opposite the liquid crystal layer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 11 is a prior-art cross section of a simplified LCD display.

Figure 1:
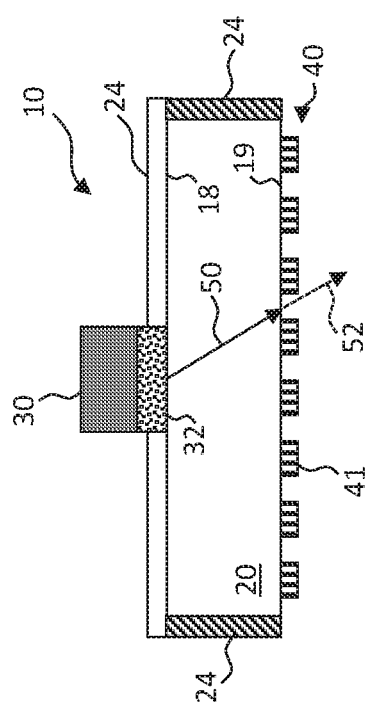
FIG. 1 is a cross section of an exemplary embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
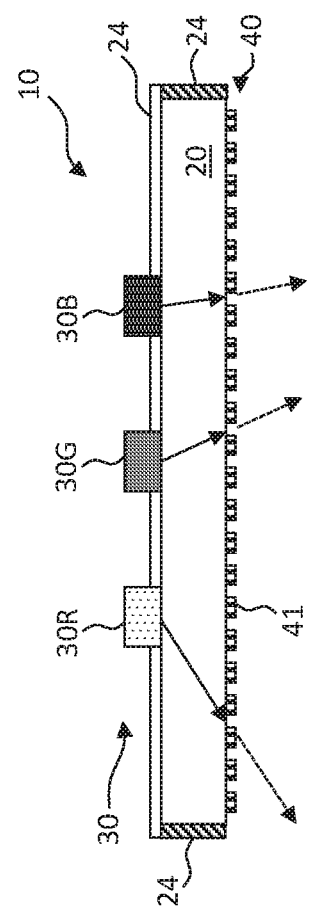
FIG. 2 is a cross section of another exemplary embodiment of the present invention having several different LEDs.

Referring to the cross sections of FIGS. 1 and 2, in some embodiments of the present invention a light-emitting diode (LED) structure 10 comprises an LED substrate 20 having a first side 18 and a second side 19 opposing the first side 18. One or more light-emitting diodes (LEDs) 30 are disposed on the first side 18 and arranged to emit light through the LED substrate 20 and through the opposing second side 19. A wire-grid polarizer 40 having an array of wires 41 is disposed on the second side 19 and arranged to linearly polarize light emitted from the one or more light-emitting diodes 30. In operation, the LED 30 is provided with suitable electrical power to cause the LED 30 to emit unpolarized light 50 through the LED substrate 20 and the opposing second side 19 to the wire-grid polarizer 40. The wire-grid polarizer 40 linearly polarizes the unpolarized light 50 emitted from the LED 30 to emit polarized light 52 from the LED structure 10.

The LEDs 30 can have a substrate (e.g., a native source wafer) separate and distinct from the LED substrate 20 and can include dielectric insulators, reflectors, and the like as are conventionally found in LEDs or integrated circuit structures (not shown). The LEDs 30 can be micro-LEDs, for example having a size less than 3×10 microns, less than 3×3 microns, or even having one or more dimensions on the order of one micron. Arrays of 3×10 micron LEDs 30 have been micro-transfer printed to a substrate and operated to emit light.

The LED substrate 20 can be a glass, polymer, or semiconductor substrate formed or processed using photolithographic methods and materials. The LED substrate 20 can be a non-native substrate to the LEDs 30 and the LEDs 30 can be micro-transfer printed onto the LED substrate 20 from a native source wafer, for example a compound semiconductor wafer such as GaN. Wire-grid polarizers are known in the art and can include an array of substantially one-dimensional fine metal wires 41 extending in a desired direction to achieve desired polarization, for example having a pitch of 400-800 nm. Such wires 41 are readily formed on small substrates (e.g. substrates having a size of a conventional semiconductor wafer) using high-resolution fine lithography found in the integrated circuit arts.

In some embodiments, the LED substrate 20 can have additional sides other than the first and second sides 18, 19, for example other sides orthogonal to the first or second sides 18, 19, such as edges. These additional sides can have a reflective layer 24 or coating to reflect light from the LEDs 30 toward the wire-grid polarizer 40. A reflective layer 24 can also be disposed on the first side 18 of the LED substrate 20 around the one or more LEDs 30. The reflective layers 24 can be, for example, metal layers such as aluminum or silver evaporated onto the various sides of the LED substrate 20 and patterned (on the first side 18) as necessary using photolithographic methods and materials, such as physical or chemical vapor deposition.

In some embodiments of the present invention and as shown in FIG. 1, the LED structure 10 emits white light. Since LEDs 30 typically emit a saturated colored light, a color converter can be used to convert a portion of the LED-emitted light to a complementary color of light. For example, the LED 30 can be a blue-light-emitting LED and the color converter can be phosphors/QDs 32 that convert at least and only a portion of the incident blue light to emitted yellow light. The combination of blue and yellow light appears white. Thus, the one or more LEDs 30 all emit light of a first frequency (e.g., blue) and phosphors/QDs 32 disposed on, in, or over the LED substrate 20 convert the light emitted from the one or more LEDs 30 to light of a second frequency (e.g., yellow) lower than the first frequency. The combination of the LED-emitted light and the phosphor-emitted light can appear white. A color-converter material refers to a material that comprises a color converter, wherein the color converter at least partially changes/converts incident light of one wavelength to light of another wavelength (e.g., by down-conversion). "Color-change material", "color-conversion material", and "color-converter material" are used interchangeably herein. A color-change material can comprise one or more phosphors, one or more quantum dots, or both. In certain embodiments, different phosphors or different quantum dots in a color-change material convert incident light of one wavelength to different lights with distinct wavelengths. For example, a blue-light-emitting LED can be used in combination with a color-converter material that comprises quantum dots that emit a plurality of colors of light such that, in combination with a portion of the blue light emitted from the LED, the combination appears white. A color-converter material can comprises color converters embedded in a matrix (e.g., a polymer matrix). A plurality of color-converter materials, each comprising phosphors/QDs 32 that emit a particular color of light, can be used in combination (e.g., disposed collectively on, in, or over the LED substrate 20) with one or more LEDs 30 to produce white light.

Referring to FIG. 2, the LED structure 10 can include a plurality of LEDs 30. The LEDs 30 can be different red, green, and blue LEDs 30R, 30G, 30B that emit correspondingly different colors of light, for example red, green, and blue light. Other colors, such as cyan or yellow can also be used or included (not shown). The different colors of light can be matched to color filters used in a display, for example a liquid crystal display to improve display efficiency by reducing the absorption of unwanted light and improving the display color gamut.

Figure 3:
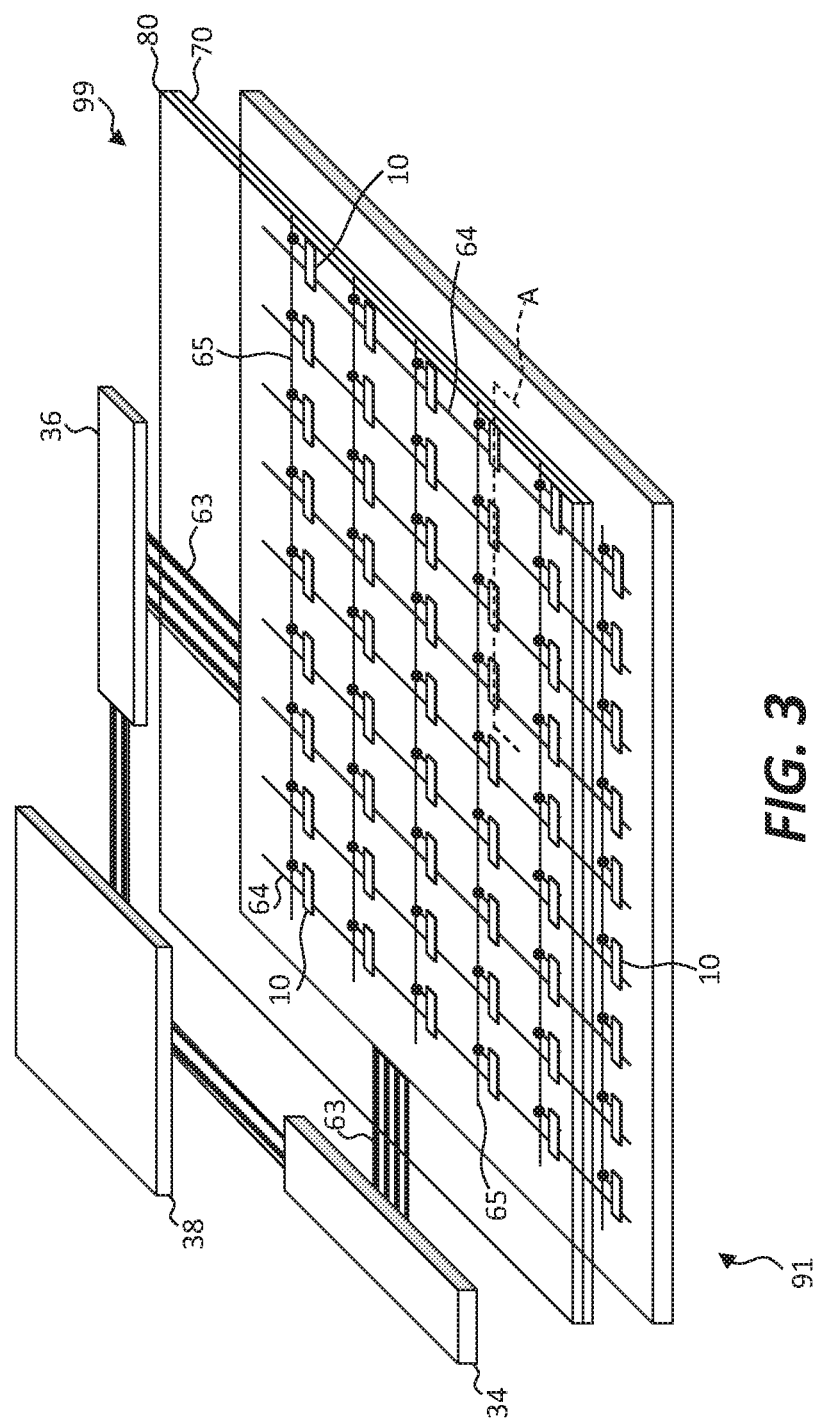
FIG. 3 is a perspective of an exemplary embodiment of the present invention having a plurality of LED substrates forming a backlight in an LCD.

As shown in FIG. 3, a plurality of LED structures 10 can be spatially distributed within or over an LED-structure backlight 91 to form a direct-lit backlight 91. Alternatively, a plurality of LED structures 10 can be employed in an edge-lit backlight arrangement (not shown). The LED structures 10 are provided with electrical power and control signals through wires, such as column and row wires 64, 65 that control the LEDs 30 in the LED structures 10, for example with a passive- or active-matrix control method. The LED structures 10 can include active-matrix control circuitry in the LED substrate 20 (for example if the LED substrate 20 is a semiconductor substrate) or an additional control integrated circuit (such as a small integrated circuit chiplet) that can be disposed and interconnected with the LEDs 30 on the LED substrate 20. The column and row wires 64, 65 can be connected to column controllers 36 and row controllers 34, respectively, through buses 63. The row and column controllers 34, 36 can be controlled, in turn, by a display controller 38. Forming row and column wires 65, 64, for example from patterned metal deposition over a substrate, is a common practice in the display industry and display, row, and column controllers 38, 34, 36 are commercially available integrated circuits. The LED-structure backlight 91 can be used in a liquid crystal display 99 having a liquid crystal layer 70 and front polarizer layer 80 through which light from the LED-structure backlight 91 is emitted.

Figure 4:
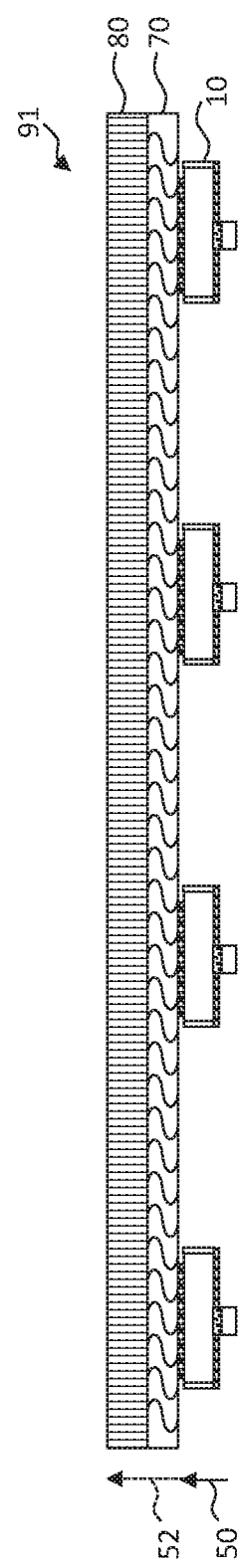
FIG. 4 is a cross section of an exemplary embodiment of the present invention having a plurality of LED substrates forming a backlight taken across cross section line A of FIG. 3.

Conventional backlights 90 typically include a dielectric diffuser 66, for example made of molded plastic to diffuse and make uniform light from the backlight 90 (FIG. 11). In some embodiments of the present invention illustrated in FIG. 4, a plurality of LED structures 10 are relatively small, for example having a horizontal or vertical (x or y) LED substrate 20 dimension as small as in the range of 1 to 20 microns. The thickness of the LED substrate 20 can be as small as in the range of ½ micron to five or ten microns. The LED substrate 20 can also be larger. Conventional LEDs typically have sizes of a millimeter and a small surface mount LED size is 25 microns. Thus, certain embodiments of the present invention can provide a larger number of much smaller micro-LEDs 30 that are distributed within an LED-structure backlight 91 to provide light with a greater uniformity over the backlight area than conventional backlights 90. In such embodiments, a light diffuser layer 66 can be unnecessary, reducing cost, weight, and thickness in an LCD. Furthermore, the larger number of micro-LEDs 30 provide a higher resolution array of light emitters that improve the resolution of local dimming by providing control of the backlight to fewer pixels in the display 99. In FIG. 4, the LED structures 10 are affixed to the LC glass enclosing the liquid crystal layer 70. In some embodiments, the LED structures 10 can be affixed to another substrate, such as a backlight substrate (not shown) or to the LC glass as shown in FIG. 4 as part of the liquid crystal layer 70 in the LED-structure backlight 91.

In another embodiment, the LED-structure backlight 91 includes a light diffuser, for example a polarization-preserving light diffuser. The LED structure 10 can be disposed on, over, or adjacent to the light diffuser, for example a plurality of LED substrates 20 are spatially distributed over, on, or adjacent to a common side of the light diffuser. According to certain embodiments of the present invention, a light diffuser is a polarization-preserving light diffuser to maintain the polarization of the light emitted through the wire-grid polarizer 40.

Figure 5:
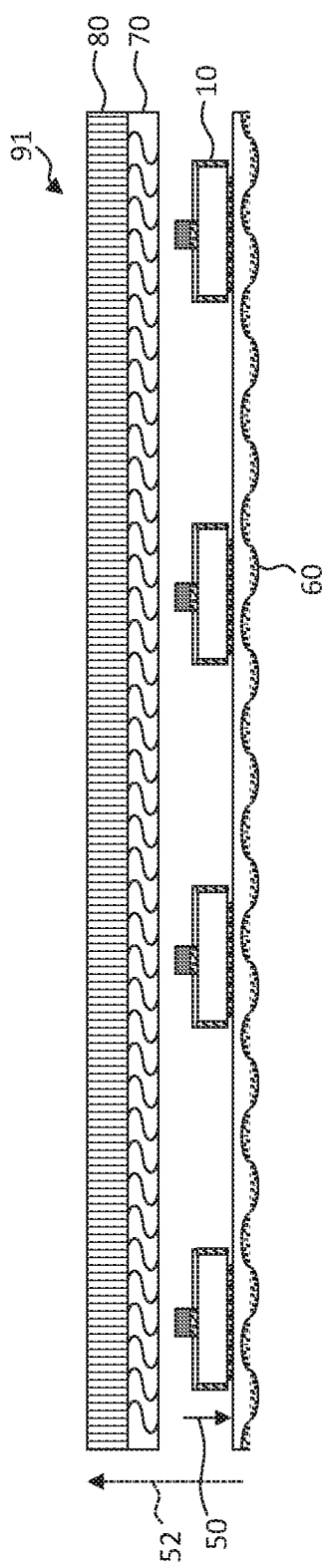
FIG. 5 is a cross section of an alternative exemplary embodiment of the present invention having a plurality of LED substrates and a reflective polarization-preserving reflective diffuser forming a backlight.
Figure 8:
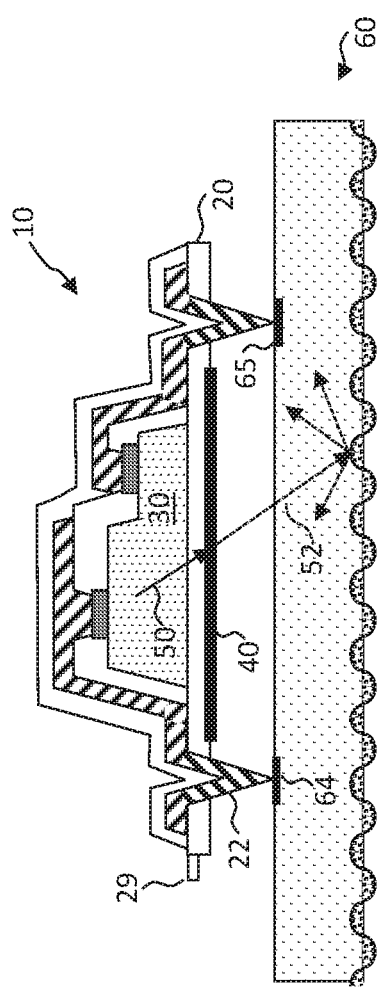
FIG. 8 is a detailed cross section of a micro-transfer printed structure according to an exemplary embodiment of the present invention corresponding to FIG. 5.
Figure 9:
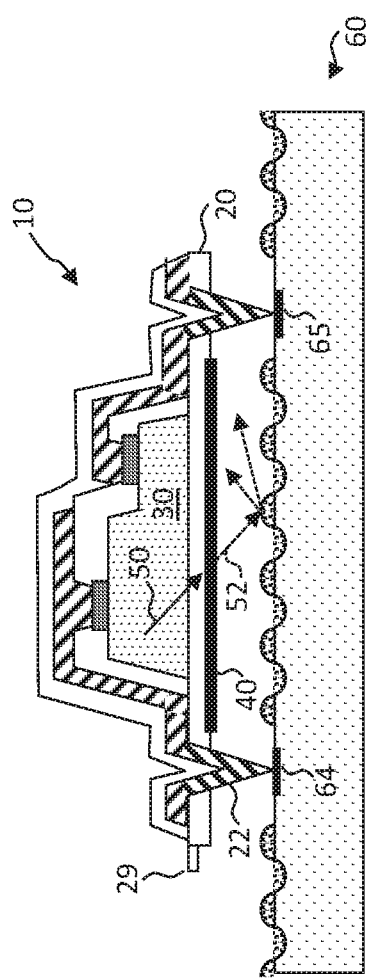
FIG. 9 is a detailed cross section of a micro-transfer printed structure according to an exemplary embodiment of the present invention.

Referring to FIG. 5, the diffuser is a polarization-preserving reflective light diffuser 60 located on a side of the LED structures 10 opposite the liquid crystal layer 70. Unpolarized light 50 emitted from the LEDs 30 is polarized by the wire-grid polarizer 40 (as shown in FIG. 1) and emitted in a direction away from the liquid crystal layer 70. The polarized light 52 is reflected by the polarization-preserving reflective diffuser 60 toward the liquid crystal layer 70. Because the LED structures 10 are so small, and typically smaller than a pixel, the polarized light 52 can be substantially uniform over the display area, for example apparently uniform to the human visual system. The LED structures 10 can be mounted on the LC glass or on the polarization-preserving reflective diffuser 60. Row and column wires 65, 64 providing control or power and ground signals can be formed on the LC glass surface and electrically connected to the LEDs 30 in the LED structure 10. In some embodiments, the row and column wires 65, 64 can be transparent. However, since the row and column wires 65, 64 can be very small, for example a few microns in width, and smaller than the pixels in the display 99 (FIG. 3), they can also be reflective or light absorbing without substantially affecting the uniform spatial distribution of the polarized light. In some embodiments, the row and column wires 65, 64 are provided on the polarization-preserving reflective diffuser 60 and electrically connected to the LEDs 30 in the LED structure 10. Again, because the row and column wires 65, 64 can be smaller than the pixels, forming the row and column wires 65, 64 on the polarization-preserving reflective diffuser 60 does not substantially affect the reflective and diffusing properties of the polarization-preserving reflective diffuser 60, especially if the row and column wires 65, 64 are reflective, for example made of metal. In some embodiments, the polarization-preserving reflective diffuser 60 is formed on or in a diffuser substrate and the reflective layer is formed on the same side as the side on which the LED structures 10 are disposed or the row and column wires 65, 64 are formed (as shown in FIG. 8). In some embodiments, the reflective layer is formed on a side opposite to the side on which the LED structures 10 are disposed or the row and column wires 65, 64 are formed (as shown in FIG. 9).

The polarization-preserving reflective diffuser 60 can include metal, a metal coating, metal particles, or metal-coated particles. In particular, the polarization-preserving reflective diffuser 60 can include a metal coating formed on a structured surface, for example made of a polymer. U.S. Pat. Nos. 8,004,758 and 7,898,734 describe a polarization preserving reflective microstructure screen, for example as used in 3D cinemas. U.S. Pat. No. 4,746,202 discloses a polarization preserving reflector and method. These structures and methods can be used in certain embodiments of the present invention and the disclosure of U.S. Pat. Nos. 8,004,758, 7,898,734, and 4,746,202 is incorporated by reference herein. In an embodiment, the gain of the reflector is controlled to optimize local diffusion uniformity and local dimming.

Figure 6:
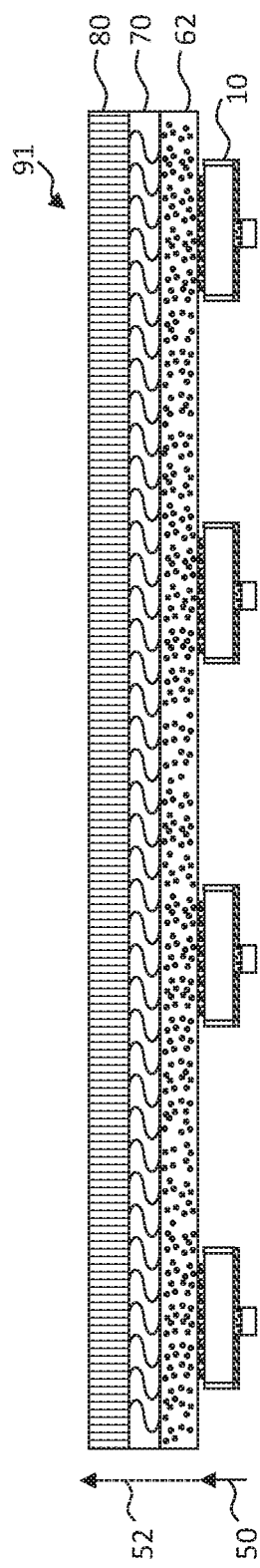
FIG. 6 is a cross section of another exemplary embodiment of the present invention having a plurality of LED substrates and a transmissive polarization-preserving reflective diffuser forming a backlight.

Referring to FIG. 6, in an alternative exemplary embodiment of the present invention, the light diffuser is a polarization-preserving transmissive light diffuser 62. The polarization-preserving transmissive light diffuser 62 is disposed between the LED structures 10 and the liquid crystal layer 70. The polarization-preserving transmissive light diffuser 62 can be or include, for example metal or metal-coated particles, or is a holographic diffuser. In particular, metal or metal-coated polymer or glass particles are disposed in a transparent matrix to provide the polarization-preserving transmissive diffuser 62. Alternatively, a holographic diffuser is provided, for example as taught in U.S. Pat. No. 9,329,430. Unpolarized light 50 emitted from the LEDs 30 is polarized by the wire-grid polarizer 40 (as shown in FIG. 1) and emitted in a direction toward the liquid crystal layer 70. The polarized light 52 is transmitted and diffused by the polarization-preserving reflective diffuser 60 toward the liquid crystal layer 70.

The LED structures 10 can be mounted on the polarization-preserving transmissive diffuser 62 (as shown) or on a backplane substrate (not shown). Row and column wires 65, 64 providing control or power and ground signals can be provided on the polarization-preserving transmissive diffuser 62 and electrically connected to the LEDs 30 in the LED structure 10. Again, because the row and column wires 65, 64 can be smaller than the pixels, forming the row and column wires 65, 64 on the polarization-preserving transmissive diffuser 62 does not substantially affect the transmissive and diffusing properties of the polarization-preserving transmissive diffuser 62, especially if the row and column wires 65, 64 are reflective, for example made of metal. In some embodiments, the polarization-preserving transmissive light diffuser 62 is formed on or in a diffuser substrate. Alternatively, the polarization-preserving transmissive diffuser 62 is formed on or in the LC glass on a side of the LC glass opposite the liquid crystals.

Because a large number of small LED structures 10 can be used in certain embodiments, the amount of diffusion required can be relatively small and local. Thus, in certain embodiments and with respect to both the polarization-preserving reflective light diffuser 60 and polarization-preserving transmissive light diffuser 62, the diffusion of the light diffuser can be spatially variable, as shown in FIG. 6. Thus, diffusion local to the LED structure 10 emission can be greater while diffusion further from the LED structure 10 emission can be reduced, for example to improve local dimming.

Figure 7:
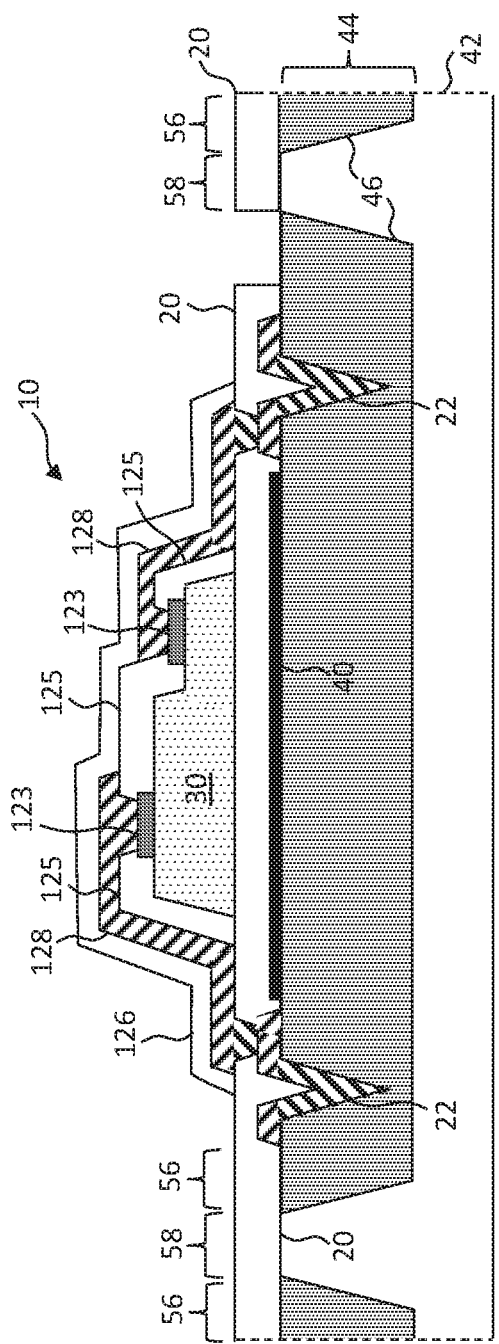
FIG. 7 is a cross section of a wafer having micro-transfer printable structures according to exemplary embodiments of the present invention.

In certain embodiments of the present invention, the LEDs 30 are micro-transfer printed from a native source wafer to the LED substrate 20 and electrical interconnections are formed on the LED substrate 20 and over the LED 30. The LED structure 10 can be micro-transfer printed to a destination substrate such as a diffuser (as shown in FIGS. 4-6) or backplane substrate (not shown). Referring to FIG. 7, a wafer 42 includes a patterned sacrificial layer 44 having anchor 58 areas separating sacrificial portions 46. The sacrificial portions 46 can be, for example, an oxide layer or a designated anisotropically etchable portion of the wafer 42, or, once etched, the gap between the LED substrate 20 and the wafer 42. The wire-grid polarizer 40 is patterned over the wafer 42 and the patterned sacrificial layer 44. The LED substrate 20 is formed or disposed on or over the wafer 42, the patterned sacrificial layer 44, and the wire-grid polarizer 40 and processed to form tethers 56 connecting the LED substrate 20 to the anchors 58. The sacrificial portions 46 are partially exposed. An LED 30 can be micro-transfer printed onto the LED substrate 20, insulating dielectric structures 125 formed and patterned to insulate the LED 30 and expose LED connection pads 123. Electrodes 128 are deposited and patterned to electrically connect to the LED connection pads 123. An encapsulation layer 126 can be provided to provide environmental, process, and mechanical protection to the LED structure 10. The sacrificial portions 46 are etched to release the LED structure 10 from the wafer 42, leaving the LED structure 10 connected to the wafer 42 with one or more tethers 56. A micro-transfer printing stamp presses against the LED structures 20 to fracture the tethers 56 to make fractured tethers 29, and transfers the LED structures 10 to a suitable desired destination substrate, such as the LC glass or the light diffuser. The electrodes 128 can be electrically connected to the row and column wires 65, 64 after the LED structures 10 are micro-transfer printed to the destination substrate, for example using conventional flat-panel display and integrated circuit technologies. A controller chiplet can also be micro-transfer printed to the LED substrate 20 or formed in the LED substrate 20 (e.g., if the LED substrate 20 is a semiconductor) to provide control, for example active-matrix control, to the LED 30. Electrodes 128 connected to the LEDs 30 are considered connected to the LEDs 30 if the electrodes 128 are connected to a controller that is connected to the LEDs 30.

In some embodiments, the LED structure 10 includes connection posts 22 electrically connected to the electrodes 128. Thus, in an exemplary embodiment shown in FIG. 7, two or more electrodes 128 are electrically connected to the one or more light-emitting LEDs 30 and two or more connection posts 22 are electrically connected to the electrodes 128. When the LED structure 10 is micro-transfer printed to a destination substrate, the connection posts 22 can be contacted to contact pads on the destination substrate to electrically connect the electrodes 128 to row and column wires 65, 64 on the destination substrate to control the LEDs 30.

Although a variety of methods can be used to form the connection posts 22, in some embodiments, a connection post form is made in the sacrificial portion 46 for each connection post 22, for example by etching. The connection post form can be a pyramidal depression. The connection posts 22 are then constructed by forming a patterned metal layer over the form. A patterned dielectric layer (LED substrate 20) is formed over the patterned sacrificial layer 44 with a via made through the LED substrate 20 and an opening for etching the sacrificial portions 46. One or more native source wafers each having an array of micro-transfer printable circuit chiplets, for example LEDs 30 or active-matrix pixel controller circuits are provided. Each wafer can be made using different materials and process technologies, so that the chiplets are a heterogeneous group of chiplets. In particular, the wafers can be source wafers for the different red, green, and blue LEDs 30R, 30G, 30B and pixel controller and be made of different compound semiconductor or single semiconductor materials. An inorganic LED 30 is micro-transfer printed onto the LED substrate 20 from a native source wafer, a patterned dielectric structure 125 is formed to insulate the LED 30 and provide vias for LED connection pads 123, and electrodes 128 are patterned over the LED connection pads 123 and the dielectric structure 125 in electrical contact with the connection posts 22. In some embodiments, wires such as electrodes 128 are formed to electrically connect the circuit chiplets to each other and the connection posts 22, for example using photolithographic processes and materials. An encapsulation layer 126 can be provided to protect the structure from environmental or mechanical damage. The sacrificial portions 46 of the wafer 42 are etched to release the LED structures 10 from the wafer 42. The structures and layers illustrated in FIG. 7 can be made using integrated circuit and display industry materials and methods.

Figure 10:
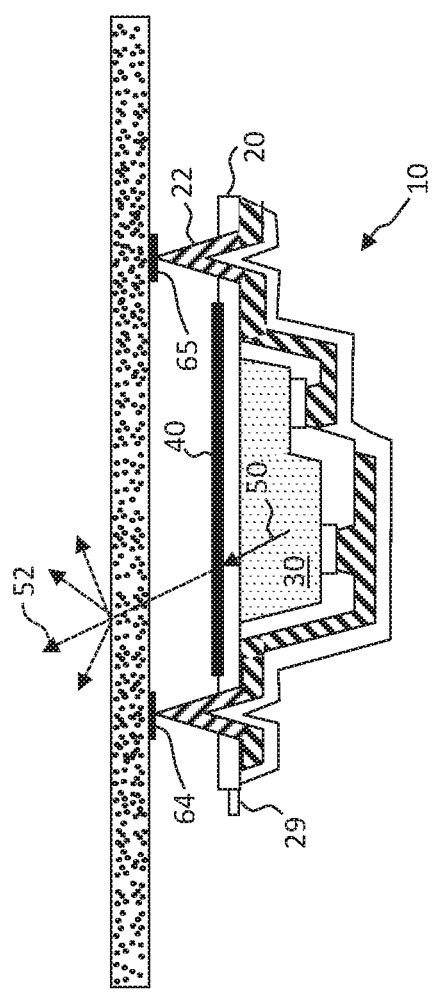
FIG. 10 is a detailed cross section of a micro-transfer printed structure according to an exemplary embodiment of the present invention corresponding to FIG. 6.

The LED structures 10 are micro-transfer printed onto a destination substrate with a stamp that fractures the one or more tethers 56 to form one or more fractured tethers 29 (as shown in FIGS. 8-10). As shown in FIGS. 8-10, the connection posts 22 are electrically connected to contact pads on the row and column wires 65, 64 to electrically connect them to the LED 30 or controller in the LED structure 10. In FIG. 8, the row and column wires 65, 64 are located on an opposite side of a substrate from the diffusive reflector. In FIG. 9, the row and column wires 65, 64 are located on the same side of a substrate as the diffusive reflector but without making electrical contact to the diffusive reflector. In operation, control, power, or ground signals are provided through the row and column wires 65, 64 to the connection posts 22 to cause the LED 30 to emit unpolarized light 50. The unpolarized light 50 polarized by the wire-grid polarizer 40 is reflected and diffused by the polarization-preserving reflective diffuser 60.

Referring to FIG. 10, the LED structures 10 are micro-transfer printed to the polarization-preserving transmissive diffuser 62 so that the connection posts 22 are electrically connected to the row and column wires 65, 64 on a side of the polarization-preserving transmissive diffuser 62 adjacent to the LED structure 10. In operation, control, power, or ground signals are provided through the row and column wires 65, 64 to the connection posts 22 to cause the LED 30 to emit unpolarized light. The unpolarized light is polarized by the wire-grid polarizer 40 is transmitted and diffused by the polarization-preserving transmissive diffuser 62.

In certain embodiments, the present invention has advantages over the prior art. Because the wire-grid polarizer 40 is only present on the LED substrates 20, a much smaller area than the display area of an LCD 99, and can be made in a high-resolution integrated circuit fabrication facility, a rear polarizer 82 having the size of the display 99 can be unnecessary and excluded so that cost, size and weight are reduced. Because many micro-transfer printed LED structures 10 can be provided in a LED-structure backlight 91, the LED-structure backlight 91 can have improved light emission uniformity and a dielectric light diffuser 66 can be unnecessary, so that cost, size and weight are reduced and better local dimming for fewer pixels at a time can be provided. Because micro-LEDs 30 are smaller and thinner than conventional LEDs, the LED-structure backlight 91 can be thinner and lighter. Micro-transfer printing provides a reduced-cost method of providing many micro-LEDs 30 in an LED-structure backlight 91, further reducing costs and improving manufacturing efficiencies. Furthermore, cost, size, and weight can be further reduced by providing the LED structures 10 and row and column wires 65, 64 on the LC glass, eliminating a separate backlight unit. Interconnecting the LED structures 10 with connection posts 22 further reduces processing costs by obviating the need to do additional interconnection steps. In another embodiment, the LED structures 10 and diffusers can be a structure that is laminated to the LC glass, reducing thickness and weight. In some embodiments, the row and column wires 65, 64 are not transparent and so can be more conductive, improving electrical and control performance of the LED-structure backlight 91.

According to certain embodiments of the present invention, the LEDs 30 are micro-transfer printed onto the LED substrate 20. The LEDs 30 can be, for example, unpackaged bare die that are directly adhered to the LED substrate 20. To be micro-transfer printed on or adhered to the LED substrate 20 means that the LED 30 is micro-transfer printed on or adhered to any of the elements of the LED substrate 20, for example upon a semiconductor layer, a patterned or doped semiconductor layer or structure, a conductor layer or patterned conductor, a dielectric layer, a patterned dielectric layer, a protective layer, a sacrificial oxide layer, an adhesive layer, or any other element of the LED substrate 20.

As used herein, separate, independent, and distinct substrates are separately constructed, optionally at different times and at different locations using at least some different processes or on different wafers to produce the LEDs 30 or optional controller. After they are constructed, the separate, independent, and distinct substrates can be transported and stored separately and independently. In certain embodiments, methods include micro-transfer printing one substrate (e.g., the LED 30) onto another separate, independent, and distinct substrate (e.g., the LED substrate 20) and electrically interconnecting them. The substrates remain separate, independent, and distinct after they are combined into a common structure, since the substrates themselves both remain present in the combined structure.

The LED connection pads 123 can be portions of the electrodes 128 or electrically conductive areas electrically connected to the electrodes 128. The row or column wires 65, 64 can include backlight connection pads that can be, for example, rectangular or circular areas of electrically conductive materials accessible or exposed to external elements such as wires or conductors, including the electrodes 128 or connection posts 22. The backlight connection pads or LED connection pads 123 can have any shape conducive to the formation of electrical connections.

Electrical connections to the backlight connection pads can be made using solder and solder methods, photolithographic processes, conductive ink deposition by inkjet, or by contacting and possibly penetrating the backlight connection pads with electrically conductive protrusions or spikes such as connection posts 22. Electrical connections between conductors or an active circuit on a substrate (e.g., the LED substrate 20, electrodes 128, or LED 30) can be made by mechanically pressing the connection posts 22 in alignment against, into, onto, or through backlight connection pads to form electrical interconnections without photolithographic processing and are described in U.S. patent application Ser. No. 14/822,864 entitled "Chiplets with Connection Posts," the disclosure of which is hereby incorporated by reference in its entirety.

The LED 30 can be any substrate or layer having light-emitting properties and on or in which electrodes 123 and LED connection pads 123 can be formed. For example, the LED 30 can be or include one or more of any of a semiconductor, a compound semiconductor, a III-V semiconductor, a II-VI semiconductor, GaN, AlGaN, GaAs, AlGaAs, GaAsP, AlGaP, AlGaInP, GaP, InGaN, and ZnSe. The LED 30 can be processed using photolithographic methods to form the electrodes 128 and can have two relatively flat and substantially parallel opposing sides. Alternatively, other methods such as micro-embossing and inkjet deposition can be used to form structures on the LED 30. The LED 30 can be crystalline. In some embodiments, the processing materials and methods of the LED 30 and electrodes 128 are at least partially different from and incompatible with the processing materials and methods of the LED substrate 20.

The LED substrate 20 and the LED 30 can take a variety of forms, shapes, sizes, and materials. In some embodiments, the LED 30 is thicker than the LED substrate 20. In other embodiments, the LED 30 is thinner than the LED substrate 20. In some embodiments, the LED 30 and the LED substrate 20 have the same thickness. In certain embodiments, the LED substrate 20 has a thickness less than 20 microns, less than 10 microns, or less than 5 microns. In certain embodiments, the LED 30 has a thickness less than 10 microns, less than 5 microns, or less than 1 micron. Alternatively, in certain embodiments, the LED 30 has a thickness greater than 0.5 microns, greater than 1 micron, greater than 2 microns, or greater than 5 microns. Such a variety of sizes can enable highly integrated and small structures useful in a corresponding variety of electronic systems.

In some embodiments of the present invention, the different LEDs 30 are formed on a common LED native source wafer, for example using photolithographic processes, or from a plurality of substantially identical LED native source wafers. In other embodiments, multiple, different LED source wafers are provided having different LEDs 30 on them. For example, a first red LED wafer has first red LEDs 30R, a second green LED wafer has second green LEDs 30G, and a third blue LED wafers has third blue LEDs 30B. the red, green, and blue LEDs 30R, 30G, 30B are micro-transfer printed from the respective native source wafers onto or over the LED substrate 20. The LED substrate 20 can have an adhesive layer to adhere the LEDs 30 to the LED substrate 20 and the LEDs 30 are micro-transfer printed onto an adhesive layer (not shown). The LED source wafers can be different and the LEDs 30 from the different LED source wafers can be different, for example having different materials, crystal lattice structures, sizes, or electrodes.

In some embodiments of the present invention, the LEDs 30 or optional controller are chiplets. Chiplets can be small integrated circuits or processed substrates, for example bare die, that are integrated into a compound device structure using micro-transfer printing. In various embodiments, one or more LEDs 30 have a width from 2 to 5 µm, 5 to 10 µm, 10 to 20 µm, or 20 to 50 µm. In various embodiments, one or more LEDs 30 have a length from 2 to 5 µm, 5 to 10 µm, 10 to 20 µm, or 20 to 50 µm. In various embodiments, at least one of the semiconductor substrate 20 and one or more LEDs 30 have a height from 2 to 5 µm, 4 to 10 µm, 10 to 20 µm, or 20 to 50 µm. In certain embodiments, such small structures provide a high degree of integration and consequently reduced manufacturing costs and improved performance.

The wafer 42 (as shown in FIG. 7) can include a plurality of LED structures 10, for example millions. In some embodiments of the present invention, and also referring to FIG. 2, a plurality of LEDs 30, each a separate, distinct, and independent LED 30, is micro-transfer printed onto or over the LED substrate 20, for example in a common print step. Likewise, LEDs 30 of a common color, for example red LEDs 30R, green LEDs 30G, or blue LEDs 30B can be micro-transfer printed onto or over the LED substrate 20, for example in a common print step. The electrodes 128 and connection posts 22 (if present) of each of the LED structures 10 can be formed in a common photolithographic step or series of steps.

U.S. patent application Ser. No. 14/743,981, filed Jun. 18, 2015, entitled Micro Assembled Micro LED Displays and Lighting Elements, describes micro-transfer printing structures and processes useful with the present invention, the disclosure of which is hereby incorporated by reference herein. For a discussion of micro-transfer printing techniques that can be used or adapted for use with methods disclosed herein, see U.S. Pat. Nos. 8,722,458, 7,622,367 and 8,506,867, the disclosure of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety.

The terms row and column are arbitrary appellations and can be exchanged.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a patterned sacrificial layer 44 or sacrificial portion 46 is considered "on" a substrate when a layer of sacrificial material or sacrificial portion 46 is on top of the substrate, when a portion of the substrate itself is the sacrificial layer 44, or when the sacrificial layer 44 or sacrificial portion 46 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
10 LED structure
18 first side
19 second side
20 LED substrate
22 connection post
24 reflective layer
29 fractured tether
30 LED/micro-LED
30R red LED
30G green LED
30B blue LED
32 phosphor/quantum dot (QD)
34 row controller
36 column controller
38 display controller
40 wire-grid polarizer
41 wire
42 wafer
44 patterned sacrificial layer
46 sacrificial portion
50 unpolarized light
52 polarized light
56 tether
58 anchor
60 polarization-preserving reflective light diffuser
62 polarization-preserving transmissive light diffuser
63 bus
64 column wire
65 row wire
66 dielectric diffuser
70 liquid crystal layer
80 front polarizer layer
82 rear polarizer layer
90 backlight
91 LED-structure backlight
99 display
123 LED connection pad
125 dielectric structure 126 encapsulation layer
128 electrode

What is claimed:

1. A light-emitting diode (LED) structure, comprising:
   a non-polarizing LED substrate having a first side and a second side opposing the first side;
   one or more light-emitting diodes (LEDs) disposed on the first side and arranged to emit light directly toward and through the LED substrate, wherein each of the one or more LEDs is non-native to the LED substrate;
   a wire-grid polarizer disposed on the second side and arranged to polarize light emitted from the one or more light-emitting diodes,
   wherein the one or more LEDs are directly adhered to the first side and the wire-grid polarizer is disposed directly on the second side.

2. The LED structure of claim 1, wherein the LED substrate has additional sides other than the first and second sides and comprising a reflective layer disposed at least on the first side of the LED substrate around the one or more LEDs or on the additional sides of the LED substrate.

3. The LED structure of claim 1, wherein the one or more LEDs emit light of a first frequency and comprising a phosphor or one or more quantum dots disposed on, in, or over the LED substrate to convert the light emitted from the one or more LEDs to light of a second frequency lower than the first frequency.

4. The LED structure of claim 1, wherein the LED structure is a white-light-emitting LED structure.

5. The LED structure of claim 1, wherein the one or more LEDs all emit light of the same color.

6. The LED structure of claim 1, wherein the one or more LEDs is at least two LEDs that emit different colors of light and comprise different semiconductor materials.

7. The LED structure of claim 1, comprising two or more electrodes electrically connected to the one or more light-emitting LEDs and two or more connection posts electrically connected to the electrodes, wherein the two or more connection posts each comprise electrically conductive protrusions.

8. A backlight, comprising:
   a polarization-preserving diffuser; and
   two or more LED structures disposed on, over, or adjacent to the polarization-preserving diffuser and non-native to the polarization-preserving diffuser, wherein each of the one or more LED structures comprises
      a non-polarizing LED substrate having a first side and a second side opposing the first side;
      one or more light-emitting diodes (LEDs) disposed on the first side and arranged to emit light directly toward and through the LED substrate, wherein each of the one or more LEDs is non-native to the LED substrate;
      a wire-grid polarizer disposed on the second side and arranged to polarize light emitted from the one or more light-emitting diodes,
      wherein the one or more light-emitting diodes (LEDs) are directly adhered to the first side and the wire-grid polarizer is disposed directly on the second side, and
   wherein the polarization-preserving diffuser is disposed to diffuse the polarized light.

9. The backlight of claim 8, wherein the one or more LED structures are spatially distributed over, on, or adjacent to a common side of the diffuser.

10. The backlight of claim 8, wherein the diffuser comprises metal, a metal coating, metal particles, or metal-coated particles, or is a holographic diffuser.

11. The backlight of claim 8, wherein the diffuser is a reflective diffuser.

12. The backlight of claim 8, wherein the diffuser is a transmissive diffuser.

13. The backlight of claim 8, wherein the diffuser is a spatially variable diffuser.

14. The backlight of claim 8, comprising a liquid crystal layer and a front polarizer layer, wherein the diffuser is a transmissive diffuser, and wherein the liquid crystal layer is disposed between the front polarizer layer and the transmissive diffuser and the transmissive diffuser is between the liquid crystal layer and the one or more LED structures.

15. The backlight of claim 8, comprising a liquid crystal layer and a front polarizer layer, wherein the diffuser is a reflective diffuser, and wherein the liquid crystal layer is disposed between the front polarizer layer and the one or more LED structures and the one or more LED structures are between the liquid crystal layer and the reflective diffuser.

16. The backlight of claim 8, comprising a liquid crystal layer and a front polarizer layer, and wherein the liquid crystal layer is disposed between the front polarizer layer and the one or more LED structures.

17. An LCD display, comprising:
   a front polarizer layer;
   a liquid crystal layer;
   two or more light-emitting diode (LED) structures non-native to the front polarizer layer and to the liquid crystal layer, each LED structure comprising:
      a respective LED substrate having a first side and a second side opposing the first side;
      one or more respective light-emitting diodes (LEDs) disposed on the first side and arranged to emit light directly toward and through the LED substrate, wherein each of the one or more LEDs is non-native to the LED substrate and wherein the one or more light-emitting diodes (LEDs) are directly adhered to the first side; and
      a respective wire-grid polarizer disposed on the second side and arranged to polarize light emitted from the one or more light-emitting diodes, wherein the liquid crystal layer is disposed between the LED substrate and the front polarizer layer and wherein the wire-grid polarizer is disposed directly on the second side.

18. The LCD display of claim 17, wherein the one or more LED structures provide polarized light, there is no rear polarizer layer between the one or more LED structures and the liquid crystal layer and the front polarizer layer is the only polarizer other than the wire-grid polarizer.

19. The LCD display of claim 17, comprising a transmissive polarization-preserving diffuser disposed between the one or more LED structures and the liquid crystal layer.

20. The LCD display of claim 17, comprising a reflective polarization-preserving diffuser disposed on a side of the one or more LED structures opposite the liquid crystal layer.

21. The LCD display of claim 17, wherein the one or more LEDs is two or more LEDs that emit different colors of light and comprise different semiconductor materials.

22. The LED structure of claim 1, wherein the LED substrate is glass, polymer, or a semiconductor.

23. An LED structure source wafer comprising:
   a patterned sacrificial layer comprising sacrificial portions spatially separated by anchors;
   an LED structure disposed over each of the sacrificial portions, the LED structure comprising:
      a non-polarizing LED substrate having a first side and a second side opposing the first side, the LED substrate comprising a tether;

one or more light-emitting diodes (LEDs) disposed on the first side and arranged to emit light directly toward and through the LED substrate, wherein each of the one or more LEDs is non-native to the LED substrate and wherein the one or more light-emitting diodes (LEDs) are directly adhered to the first side; and a wire-grid polarizer disposed on the second side and arranged to polarize light emitted from the one or more light-emitting diodes and wherein the wire-grid polarizer is disposed directly on the second side, wherein a tether physically connects the LED substrate to one of the anchors.

24. The backlight of claim 8, wherein the one or more LEDs is two or more LEDs that emit different colors of light and comprise different semiconductor materials.

25. The LED structure source wafer of claim 23, wherein the one or more LEDs is two or more LEDs that emit different colors of light and comprise different semiconductor materials.

26. The LED structure of claim 1, wherein the LED substrate comprises a fractured tether.

27. The backlight of claim 8, wherein the LED substrate comprises a fractured tether.

28. The LCD display of claim 17, wherein the respective LED substrate comprises a fractured tether.

* * * * *